United States Patent
Mahmoudabadi et al.

(10) Patent No.: US 12,538,757 B1
(45) Date of Patent: Jan. 27, 2026

(54) BOND TOOL WITH MICRO VACUUM GROOVES

(71) Applicant: HRL LABORATORIES, LLC, Malibu, CA (US)

(72) Inventors: Partia Naghibi Mahmoudabadi, Malibu, CA (US); Chiaming Chang, Malibu, CA (US)

(73) Assignee: HRL LABORATORIES, LLC, Malibu, CA (US)

( * ) Notice: Subject to any disclaimer, the term of this patent is extended or adjusted under 35 U.S.C. 154(b) by 443 days.

(21) Appl. No.: 18/063,556

(22) Filed: Dec. 8, 2022

(51) Int. Cl.
*H01L 21/683* (2006.01)
*H01L 21/67* (2006.01)

(52) U.S. Cl.
CPC .... *H01L 21/6838* (2013.01); *H01L 21/67144* (2013.01)

(58) Field of Classification Search
CPC .. H01L 21/6838; H01L 21/687; H01L 21/681
See application file for complete search history.

(56) References Cited

U.S. PATENT DOCUMENTS

| | | | | |
|---|---|---|---|---|
| 6,375,176 | B1 * | 4/2002 | Getchel | H01L 21/68792 269/21 |
| 11,742,225 | B2 * | 8/2023 | Parkhe | H01L 21/67109 29/446 |
| 2008/0089001 | A1 * | 4/2008 | Parkhe | H01L 21/6831 279/128 |

* cited by examiner

*Primary Examiner* — Lee D Wilson
(74) *Attorney, Agent, or Firm* — Lewis Roca Rothgerber Christie LLP

(57) ABSTRACT

A bond tool for bonding ultra-thin substrates includes: a mesh pattern comprising a plurality of micro grooves having a depth in a range of 1 to 10 um; a plurality of front-side vias in a center portion of the mesh pattern and having a depth in a range of 100 to 200 um; and a back-side via connected to the plurality of front-side vias. A method of manufacturing a bond tool for bonding ultra-thin substrates includes: providing a substrate comprising a top layer, a bottom layer, and an etch stop layer between the top layer and the bottom layer; etching the top layer to form a mesh pattern comprising a plurality of micro grooves and a plurality of micro pedestals between the plurality of micro grooves; etching a plurality of front-side vias in the top layer; and etching back-side via in the bottom layer to align with and connect to the front-side vias.

24 Claims, 13 Drawing Sheets

BOND TOOL WITH MICRO VACUUM GROOVES

BACKGROUND

1. Field

Aspects of embodiments of the present disclosure relate generally to a bond tool comprising micro vacuum grooves and capable of picking up ultra-thin substrates or dies, and a method of manufacturing the bond tool.

2. Description of Related Art

Die bonding is a manufacturing process used in the packaging of semiconductors. It is the act of attaching a die (or chip) to a substrate or package, also known as die placement or die attach. The process starts with picking a die from a wafer or waffle pack and then placing it at a specific location on the substrate. This is a critical step in the semiconductor and integrated circuit (IC) manufacturing process and the use of specialized equipment is critical to ensure process productivity and quality. Commercial die bonders, such as, for example, those manufactured by Smart Equipment Technology (SET) and ARC, may utilize various bonding tools that are designed to pick up the die from a wafer and transfer it to the substrate. During this process, it is important that the bonding tool not only accurately picks up the die, but does so with minimal or no damage to the die. This is especially imperative when the die is ultra-thin, for example, with a thickness of 20 um or less.

Current bond tools are typically manufactured by machining and generally have vacuum grooves that are about 100 um thick (or deep), as the utilized machining equipment cannot form micro grooves. However, the groove thickness of about 100 um is still too large to be able to pick up substrates that are 20 um thick or less without causing deformation or breakage thereto. Accordingly, there is an industry need for a bond tool with micro grooves that would be able to pick up ultra-thin substrates and dies without breaking or damaging them.

BRIEF DESCRIPTION OF THE DRAWINGS

The features and advantages of embodiments of the present disclosure will become more apparent by reference to the following detailed description when considered in conjunction with the following drawings. In the drawings, like reference numerals are used throughout the figures to reference like features and components. The figures are not necessarily drawn to scale.

SUMMARY

Figure 1:
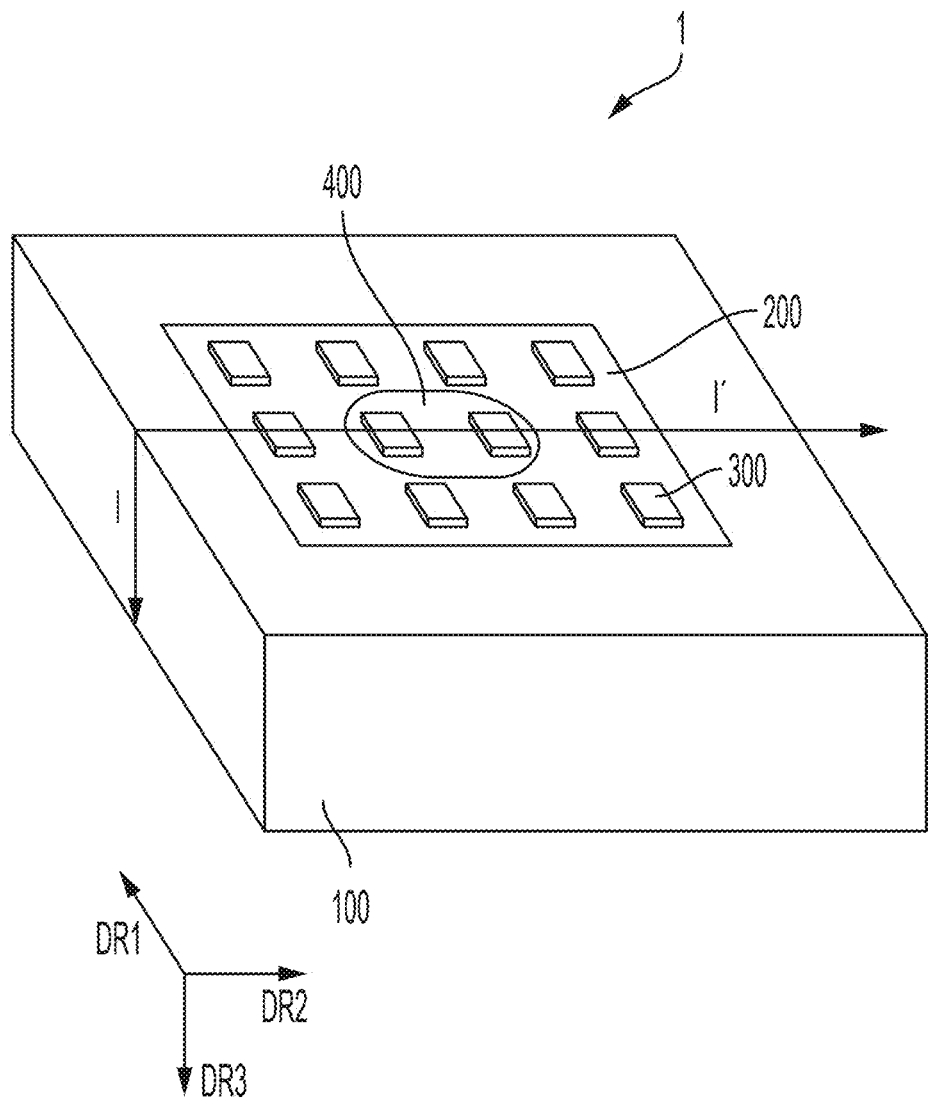
FIG. 1 is a perspective view of the bond tool according to one or more of the present embodiments.

Aspects of embodiments of the present disclosure are directed towards a bond tool capable of picking up ultra-thin die without substantial damage thereto.

Aspects of embodiments of the present disclosure are also directed towards a method for manufacturing the bond tool.

According to one or more embodiments, a bond tool for bonding ultra-thin substrates may include: a mesh pattern including a plurality of micro grooves having a depth in a range of 1 to 10 um; a plurality of front-side vias in a center portion of the mesh pattern and having a depth in a range of 100 to 200 um; and a back-side via connected to the plurality of front-side vias.

The plurality of micro grooves may have a depth of 2 um.

The plurality of front-side vias may have a depth of 150 um.

The bond tool may further include: a substrate having a top layer and a bottom layer, wherein, the top layer includes the plurality of micro grooves and the plurality of front-side vias, and the bottom layer comprises the back-side via.

The substrate may further include an etch stop layer between the top layer and the bottom layer.

The back-side via may penetrate the bottom layer and the etch stop layer, and the back-side via may have a depth in a range of 300 to 1000 um.

The bond tool may be a vacuum pressure tool configured to pick up ultra-thin substrates by vacuum suction.

The substrate may be a semiconductor wafer.

The etch stop layer may be an oxide layer.

The center portion of the mesh pattern and the back-side via may have the same diameter.

The center portion of the mesh pattern and the back-side via each may have a diameter of 50 to 1000 um.

The bond tool may be configured to pick up ultra-thin substrates having a thickness of 20 um or less.

The bond tool may be configured to be attached to a bond head of a die bonding equipment.

The bond tool may be manufactured in a cleanroom facility.

The mesh pattern may further include a plurality of pedestals between the plurality of micro grooves, each of the plurality of pedestals being a square, and a width of each of the plurality of micro grooves may be in a range of 1 to 20 um.

A method of manufacturing a bond tool for bonding ultra-thin substrates according to one or more embodiments may include: providing a substrate including a top layer, a bottom layer, and an etch stop layer between the top layer and the bottom layer; etching the top layer to form a mesh pattern including a plurality of micro grooves and a plurality of micro pedestals between the plurality of micro grooves; etching a plurality of front-side vias in the top layer; and etching a back-side via in the bottom layer to align with and connect to the front-side vias.

The plurality of micro grooves may have a depth in a range of 1 to 10 um.

The plurality of front-side vias have a depth in a range of 100 to 200 um.

The plurality of front-side vias may be etched in a center portion of the mesh pattern, and the center portion and the back-side via may have the same diameter.

Each of the plurality of micro pedestals may be a square, and adjacent ones of the plurality of micro pedestals may be spaced apart from each other by 1 to 20 um.

The method may further include dicing the substrate into a plurality of pieces to a size compatible with intended die bonding equipment.

A system of manufacturing a bond tool for bonding ultra-thin substrates according to one or more embodiments may include: means for providing a substrate including a top layer, a bottom layer, and an etch stop layer between the top layer and the bottom layer; means for etching the top layer to form a mesh pattern including a plurality of micro grooves and a plurality of micro pedestals between the plurality of micro grooves; means for etching a plurality of front-side vias in the top layer; and means for etching a back-side via in the bottom layer to align with and connect to the front-side vias.

The plurality of front-side vias may be in a center portion of the mesh pattern.

The system may further include means for dicing the substrate into a plurality of pieces to a size compatible with intended die bonding equipment.

This summary is provided to introduce a selection of features and concepts of embodiments of the present disclosure that are further described below in the detailed description. This summary is not intended to identify key or essential features of the claimed subject matter, nor is it intended to be used in limiting the scope of the claimed subject matter. One or more of the described features may be combined with one or more other described features to provide a workable device.

DETAILED DESCRIPTION

Hereinafter, example embodiments will be described in more detail with reference to the accompanying drawings, in which like reference numbers refer to like elements throughout. The subject matter of the present disclosure, however, may be embodied in various different forms, and should not be construed as being limited to only the illustrated and described embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, acts, operations, elements, and/or components, but do not preclude the presence or addition of one or more other features, integers, acts, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

As used herein, unless otherwise defined, a diameter of refers to an average diameter. The average particle size D50 may be measured by a suitable technique. Also, when referenced elements are spherical or circular, "diameter" indicates a spherical or circular diameter, and when the elements are non-spherical or circular, the "diameter" indicates a major axis length or an average major axis length.

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions may be stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the example embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Although relative terms such as "outer," "inner," "upper," "lower," and similar terms have been used herein to describe a spatial relationship of one element to another, it is understood that these terms are intended to encompass different orientations of the various elements and components of the invention in addition to the orientation depicted in the figures.

Additionally, as used herein, the term "substantially," "about," and similar terms are used as terms of approximation and not as terms of degree, and are intended to account for the inherent deviations in measured or calculated values that would be recognized by those of ordinary skill in the art.

The tasks described above may be performed in the order described or in any other suitable sequence. Additionally, the methods described above are not limited to the tasks described. Instead, for each embodiment, one or more of the tasks described above may be absent and/or additional tasks may be performed.

Furthermore, as used herein, when a component is referred to as being "on" another component, it can be directly on the other component or components may also be present therebetween. Moreover, when a component is component is referred to as being "coupled" to another component, it can be directly attached to the other component or intervening components may be present therebetween.

One or more embodiments of the present disclosure are directed toward a bond tool for picking up and bonding ultra-thin substrates.

The present disclosure relates to various embodiments of a bond tool for picking up and bonding ultra-thin substrates (or dies), where the bond tool includes a top layer, a bottom layer, and an etch stop layer therebetween, a mesh pattern including a plurality of micro grooves in the top layer, a portion in the center of the bond tool that penetrates through the top layer, etch stop layer, and bottom layer, and includes a plurality of front-side vias formed in the top layer. The bond tool is configured to be adapted to pick up ultra-thin substrates, hold them in a substantially flat position, and bond them to a receiving substrate substantially without any deformations (or without any major or substantial deformations). The bond tool may connect the dimensions that on one hand are typically achieved in machine shops (e.g., in the order of sub-mm or above), and on the other hand are achieved by semiconductor micro-machining technique in the cleanrooms (e.g., in the order of sub-mm or below).

Referring to FIG. 1, a bond tool 1 comprises a substrate 100, a mesh pattern on the surface of the substrate 100 and comprising a plurality of micro grooves 200. Each of the plurality of micro grooves 200 may have a depth in a range of 1-10 um, for example, 2 um. However, the depth of the plurality of micro grooves 200 may be any suitable value that facilitates suitable mechanical robustness of the bond tool 1. The depth of the micro grooves 200 may be measured in a thickness direction of the substrate (e.g., in a third direction DR3 crossing (e.g., substantially perpendicular to) the first direction DR1 and the second direction DR2).

Some of the plurality of micro grooves 200 may extend in a first direction DR1, and others of the plurality of micro grooves 200 may extend in a second direction DR2 crossing (e.g., being substantially perpendicular to) the first direction DR1. Accordingly, the plurality of micro grooves 200 may form a mesh pattern on the surface of the substrate 100.

The micro grooves 200 may have a width (measured in the first direction DR1 or the second direction DR2) in a range of 1-20 um, for example, 10 um.

The mesh pattern may further comprise a plurality of micro pedestals 300. The plurality of micro pedestals may be formed in a space between adjacent micro grooves 200. During the manufacturing process of the bond tool 1, to be described in more detail herein below, the plurality of micro grooves 200 are etched on the substrate 100, and the remaining unetched portions of the substrate 100 form the plurality of micro pedestals 300.

The micro pedestals 300 may have a square shape, when viewed in a plan view, however embodiments of the present disclosure are not limited thereto. For example, the micro pedestals 300 may have a rectangular shape, a rhombus shape, etc., depending on the shape and etching pattern of the micro grooves 200.

When the micro pedestals 300 have a square shape, the dimensions of each micro pedestal 300 may be 10 um by 10 um (e.g., a length of 10 um in the first direction DR1 and a width of 10 um in the second direction DR2). However, embodiments of the present disclosure are not limited thereto, and the micro pedestals 300 may have any suitable length and width, so long as the bond tool 1 is capable of picking up and bonding ultra-thin substrates. The length and width of each of the micro pedestals 300 depends on the spacing between the micro grooves 200.

According to one or more embodiments, the mesh pattern may include a center portion 400. The center portion 400 may be positioned substantially in the center of the mesh pattern and may have a shape of a substantially hollow cylinder passing through the substrate 100. However, embodiments of the present disclosure are not limited thereto. For example, the center portion 400 may have any shape suitable for manufacturing the front-side and back-side vias to be described in more detail herein below, for example, a shape of a hollow rod, tube, column, etc. When the center portion 400 has a cylindrical shape, a diameter of the center portion 400 may be in a range of 50-1000 um, for example, 450 um, or 400 um, but embodiments of the present disclosure are not limited thereto. The diameter of the center portion 400 may be any suitable diameter that allows for sufficient (or suitable) vacuum flow from the back-side via 600 to the front-side vias 500, as well as suitable mechanical strength of the center portion 400. One end portion of the center portion 400 (e.g., the top end portion) may be covered by the mesh pattern (e.g., the mesh pattern may extend over the center portion 400). After the front-side vias 500 and the back-side via 600 are etched, a portion of the mesh pattern may be suspended over the center portion 400 akin to a membrane. If the diameter of the center portion 400 is too large, the suspended mesh pattern may be more susceptible to breaking, and if the diameter of the center portion 400 is too small, there may be insufficient vacuum through the center portion 400 to hold the die substrate.

Figure 2:
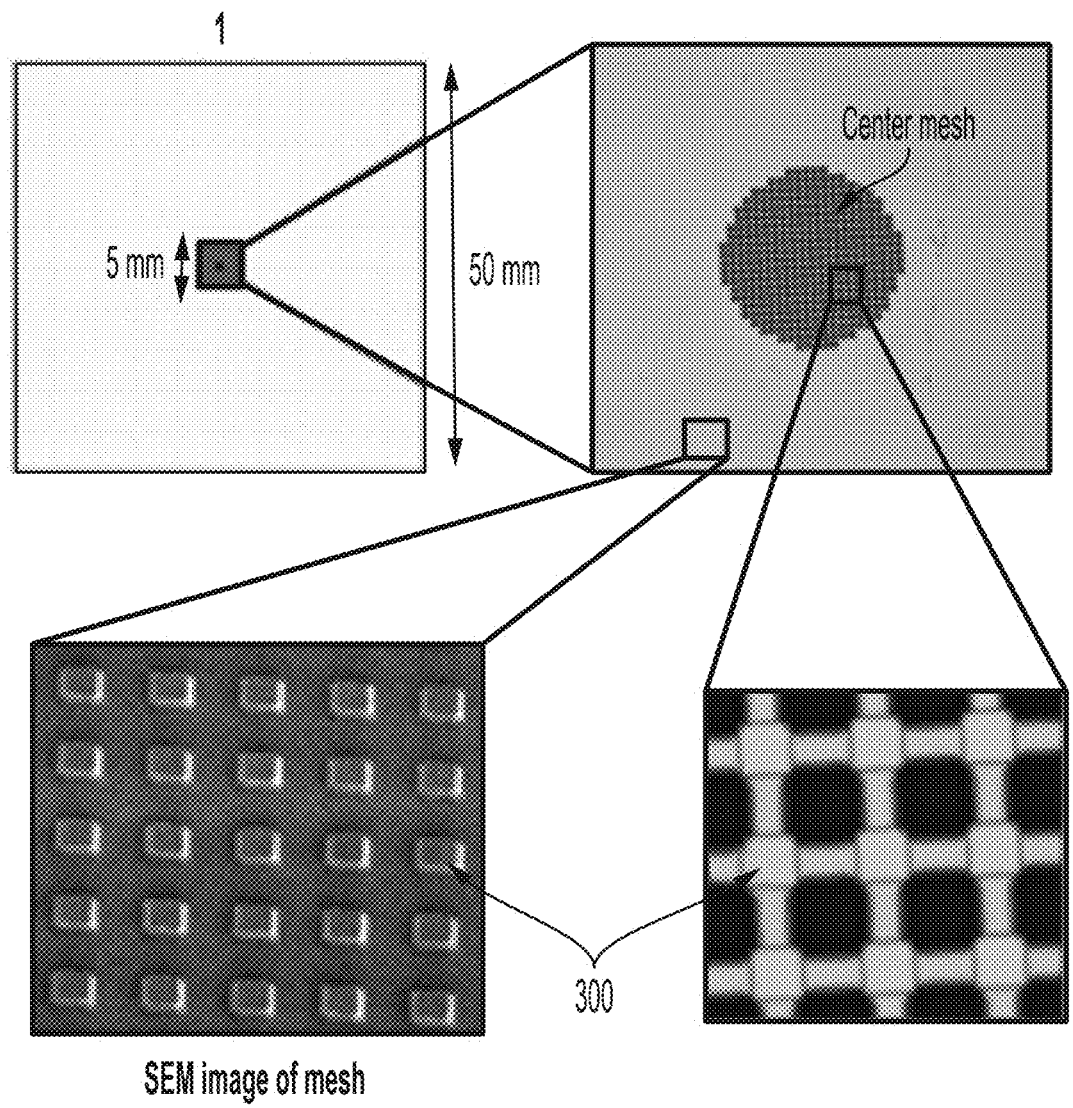
FIG. 2 is a plan view of the bond tool according to one or more of the present embodiments.

FIG. 2 is a plan view showing proportional size relationship between the bond tool 1 and the mesh pattern. For example, as shown in FIG. 2, the bond tool 1 may be a 50 mm×50 mm square, when viewed in a plan view. The size of the bond tool 1 may correspond to a size of the bonder's head of the die bonder with which the bond tool 1 is to be utilized. For example, the size of the bond tool 1 may be the same as the size of the bonder's head. The mesh pattern may be a 5 mm×5 mm square, when viewed in a plan view, and may be positioned substantially in the center of the top surface of the bond tool 1. The size of the mesh pattern may correspond to the size of the die substrate intended for pick up. For example, the size of the mesh pattern may be the same as the size of the die substrate to be picked up by the bond tool 1. The mesh pattern may include the plurality of micro grooves 200 and micro pedestals 300 arranged in both the first and the second direction DR1 and DR2.

The center portion 400 may be positioned substantially in the center of the mesh pattern and may have a circular cross-section, although embodiments of the present disclosure are not limited thereto. The center portion 400 may be substantially hollow inside, except for the front-side vias 500 (see FIG. 3). As is shown in the bottom right image of FIG. 2, the center portion 400 may be substantially hollow inside and may be covered by a portion of the mesh pattern remaining after the front-side vias 500 are etched. The darker portions in a center between the four micro pedestals 300 that together form a square pattern correspond to the etched front-side vias 500. For example, the front-side vias 500 may be etched in portions of the micro grooves 200 that are positioned in the center between four adjacent micro pedestals 300 that together form a square pattern. Here, the unetched portions of the micro grooves 200 may connect the micro pedestals 300 that surround the front-side vias 500.

During the bonding process, a vacuum environment may be formed inside the center portion 400 that facilitates the picking up, flattening, and holding the picked up die, as will be described in more detail herein below. For example, the vacuum flow may go from the back-side via 600 to the front-side vias 500, and then may get distributed in the entire mesh pattern that is positioned below the die substrate and holds the die substrate.

Figure 3:
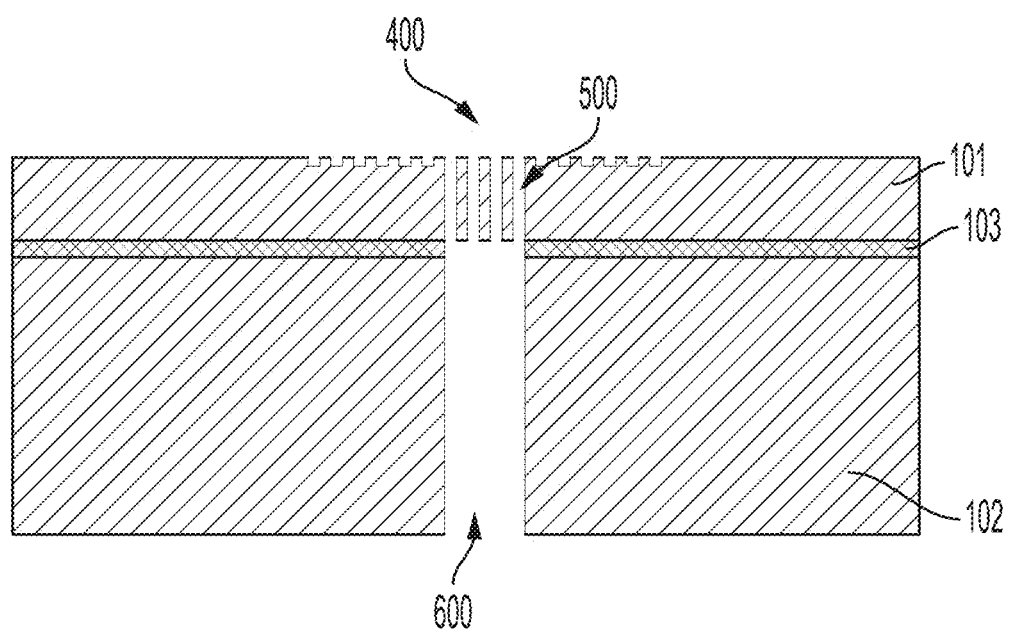
FIG. 3 is a cross-sectional view of the bond tool of FIG. 1 taken along line I-I'.

FIG. 3 is a cross-sectional view taken along line I-I' of FIG. 1. As shown in FIG. 3, the center portion 400 may include front-side vias 500. The front-side vias 500 may correspond to and align with those of the plurality of micro grooves 200 that are positioned inside the center portion 400. For example, the front-side vias 500 may be etched in portions of the micro grooves 200 that are positioned in the center between four adjacent micro pedestals 300 that together form a square pattern. The front-side vias 500 may be provided on the front side of the substrate 100 when viewed in a plan view (e.g., top side of the substrate 100 when viewed in the cross-sectional view as in FIG. 2).

The front-side vias 500 may have a depth in the thickness direction of the substrate in a range of 100-200 um, for example, 150 um. When the front-side vias 500 have the depth in this range, suitable mechanical robustness of the bond tool 1 may be obtained. However, embodiments of the present disclosure are not limited thereto, and the depth of the front-side vias 500 may suitably vary so long as suitable via resolution and pitch can be obtained.

The center portion 400 may further include a back-side via 600. The back-side via 600 may be provided on a back side of the substrate 100 facing the top side (e.g., may be provided on a low side of the substrate 100 when viewed in the cross-sectional view as in FIG. 3). The back-side via 600 may have any suitable shape, for example, a shape of a cylinder, a rod, a tube, a parallelepiped, etc. The back-side via 600 shown in the drawings has a cylindrical shape, but embodiments of the present disclosure are not limited thereto.

A cross-sectional shape of the back-side via 600 may correspond to a cross-sectional shape of the center portion 400. For example, the back-side via 600 and the center portion 400 may both have the cross-sectional shape of a circle and may have the same diameter. For example, the back-side via 600 and the center portion 400 may each have a diameter of 400 um, but embodiments of the present disclosure are not limited thereto.

The back-side via 600 may have a depth in the thickness direction of the substrate in a range of 300-1000 um, for example, 450 um. When the front-side vias 500 have the depth in this range, suitable mechanical robustness of the bond tool 1 may be obtained. The back-side via 600 and the front-side vias 500 may be connected, as shown in FIG. 3.

The substrate 100 may be formed of a suitable semiconductor material that has suitable stiffness (e.g., hardness) to maintain suitable mechanical robustness of the bond tool 1. For example, the substrate 100 may be formed of silicon (Si), silicon germanium (SiGe), silicon-on-insulator (SOI), III-V semiconductors (such as gallium arsenide (GaAs) and/or indium phosphide (InP)), glass materials, etc., without limitation. The substrate 100 may have a thickness corresponding to suitable mechanical robustness of the substrate 100. For example, the substrate 100 may have a thickness of 600 um or more, without limitation.

The substrate 100 may include, referring to FIG. 3, a top layer 101 and a bottom layer 102, to be described herein below in more detail. The top layer 101 is the layer in which the front-side vias 500 are formed, and thus the top layer 101 may have substantially the same thickness as the depth of the front-side vias 500. For example, the top layer 101 may have a thickness in a range of 100-200 um, for example, be 150 um thick, but embodiments of the present disclosure are not limited thereto. The top layer 101 may be formed of the same material as the substrate 100. For example, the top layer 101 may be formed of silicon (Si), silicon germanium (SiGe), silicon-on-insulator (SOI), III-V semiconductors (such as gallium arsenide (GaAs) and/or indium phosphide (InP)), glass materials, etc., without limitation.

The bottom layer 102 may be formed of the same material as the top layer 101. For example, the top layer 101 may be formed of silicon (Si), silicon germanium (SiGe), silicon-on-insulator (SOI), III-V semiconductors (such as gallium arsenide (GaAs) and/or indium phosphide (InP)), glass materials, etc., without limitation. According to one or more embodiments, the bottom layer 102 may have a thickness in a range of 300-1000 um, for example, be 450 um thick, or 400 um thick, but embodiments of the present disclosure are not limited thereto.

The substrate 100 may further include an etch stop layer 103. The etch stop layer 103 may be provided between top layer 101 and the bottom layer 102. The etch stop layer 103 may have a thickness in a range of 1-5 um, but embodiments of the present disclosure are not limited thereto. The etch stop layer 103 may be formed of any suitable material capable of functioning as a stop against (e.g., resisting) the etching process utilized to etch the front-side vias 500. For example, the etch stop layer 103 may be formed of silicon oxide, silicon dioxide, silicon nitride, etc., without limitation.

The back-side via 600 is formed in both the bottom layer 102 and the etch stop layer 103, and thus the combined thickness of the bottom layer 102 and the etch stop layer 103 may be substantially the same as the depth of the back-side via 600.

The bond tool 1 may be manufactured in a cleanroom facility utilizing semiconductor microfabrication techniques. Cleanrooms control humidity, contamination, temperature, pressure and/or the like of the facility, to ensure that contaminants such as dust and dirt in the atmosphere do not interfere with the manufacturing process. Conditions of the cleanroom may be adjusted according to the manufacturing requirements of the bond tool 1. For example, Class 1000, Class 100, and/or Class 1 cleanroom may be utilized, without limitation. The bond tool 1 may be manufactured utilizing microfabrication or micromachining techniques, such as, for example, dry plasma etching to be described in more detail herein below, but embodiments of the present disclosure are not limited thereto. As described above, the materials for the bond tool 1 may be semiconductor materials, such as, for example, silicon.

The cleanroom microfabrication method of the present embodiments shows significant improvements over the machining methods generally utilized to manufacture die bonding equipment. Indeed, generally used machining techniques may be directed at materials such as metals, alloys, ceramics, etc., rather than semiconductor materials as in the present embodiments. Furthermore, the machine shops may not be able to achieve grooves that are less than about 100 um deep. However, such grooves may not be able to successfully or suitably pick up ultra thin die with thickness at or below 20 um, and may cause damage to the die during the bonding process.

When the bond tool 1 of the present embodiments is utilized in a die bonder, very thin dies (substrates) may be picked up and bonded to a receiving substrate substantially without any deformation (e.g., without any major or substantial deformation). For example, dies with thickness of 20 um or below may be successfully or suitably picked up and bonded by the bond tool 1. Furthermore, because thin dies with thickness at or below 20 um may a high degree of curvature, the bond tool 1 may also help flatten the die and hold the die flat (or substantially or suitably flat) during the transfer and bonding to the receiving substrate.

The bond tool 1 of the present embodiments may be utilized with any suitable die bonding apparatus, for example, with Smart Equipment Technology (SET) die bonders such as FC300 High Precision Die/Flip Chip Bonder, without limitation. For example, any suitable die bonder or die bonding equipment may be utilized. In one or more embodiments, the bond tool 1 may be connected to a bond head of a die bonder.

The bond tool 1 may be utilized in a suitable die bonder. As described above, the area of the bond tool 1 may be the same as the area of the bonder's head of the die bonder, and the size (area) of the mesh pattern may be the same as the area of the die substrate to be picked up. During the operation of the die bonder, the bonder's head may first pick up the bond tool 1, and then the bond tool 1 may pick up the die, transfer it to the bond site, and bond it to the designated receiving substrate utilizing suitable pressure and temperature.

The following description of an example operation of the bond tool 1 of the present embodiments illustrates how the bond tool 1 can facilitate in the bonding of ultra thin die to the receiving substrate, without causing any major or substantial damage to the die. As such, the bond tool 1 shows significant improvement over bond tools manufactured in machine shops and utilizing machining techniques.

Figure 4A:
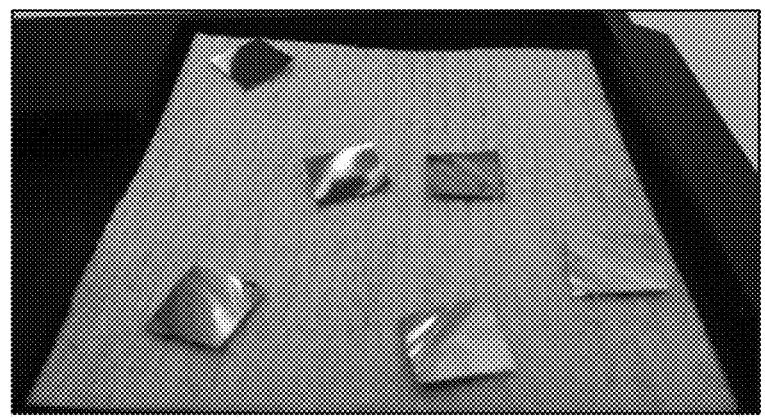
FIGS. 4A and 4B are photographs of a thin die, before and after it is picked up by the bond tool according to one or more of the present embodiments.
Figure 4B:
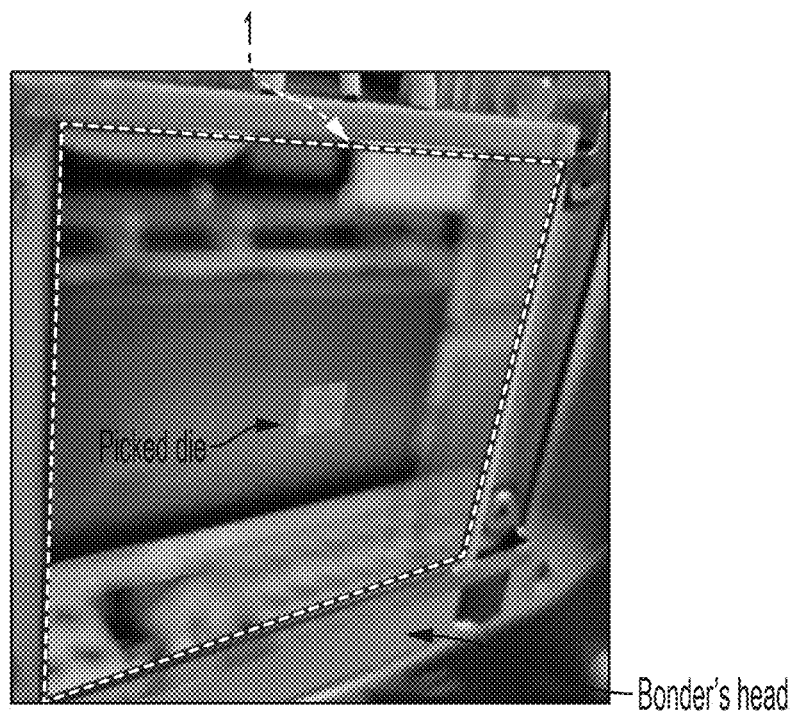

FIG. 4A is a photograph of thinned die—before it is picked up by the bond tool 1—that has a relatively high degree of curvature. The die had a square shape of approximately 5 mm×5 mm, and the thickness of the die was about 14 um. FIG. 4B is a photograph of the die in FIG. 4A after it is picked up by the bond tool 1 that is connected to a head of a die bonder. As can be seen from FIGS. 4A and 4B, the thinned die that initially had a relatively high degree of curvature can be picked up and held substantially flat by the bond tool 1 of the present embodiments.

Figure 5:
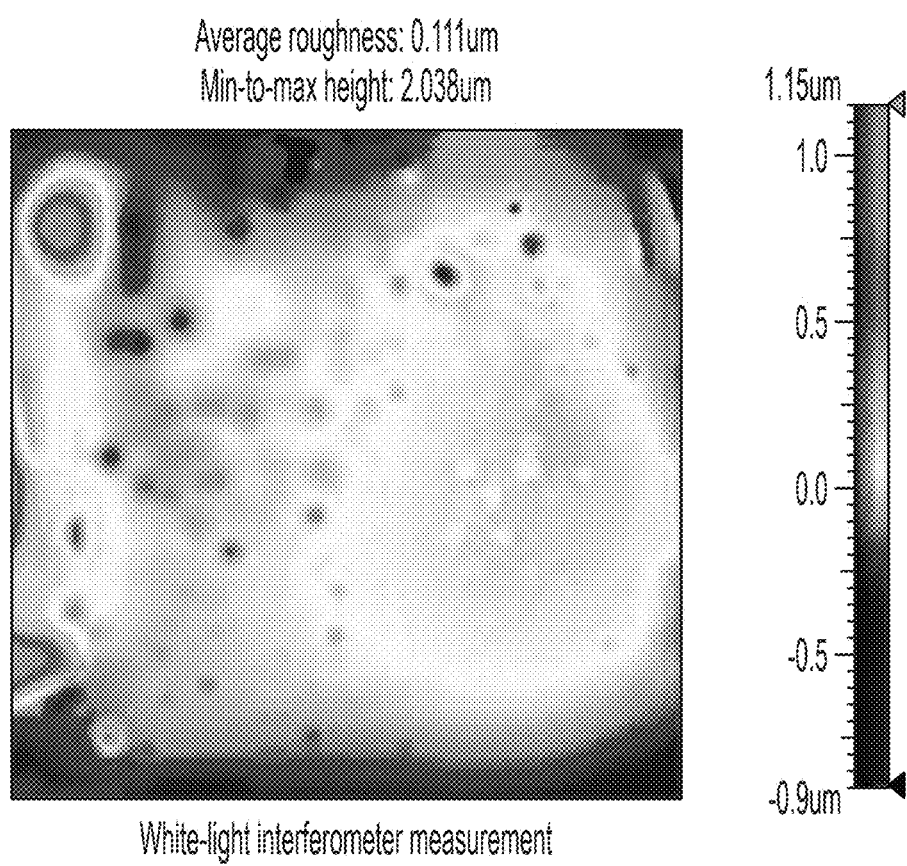
FIG. 5 shows results of an average roughness measurement taken with a white-light interferometer.

After the die shown in FIGS. 4A and 4B was bonded to a receiving substrate, average roughness of the bonded die was measured with white-light interferometer, and the results are shown in FIG. 5. As shown in FIG. 5, the average roughness of the bonded die as measured by the white-light interferometer was at 0.111 um. This value confirms that the bonded die was bonded in a substantially flat configuration and substantially without any deformation (e.g., without any major or substantial deformation).

Figure 6:
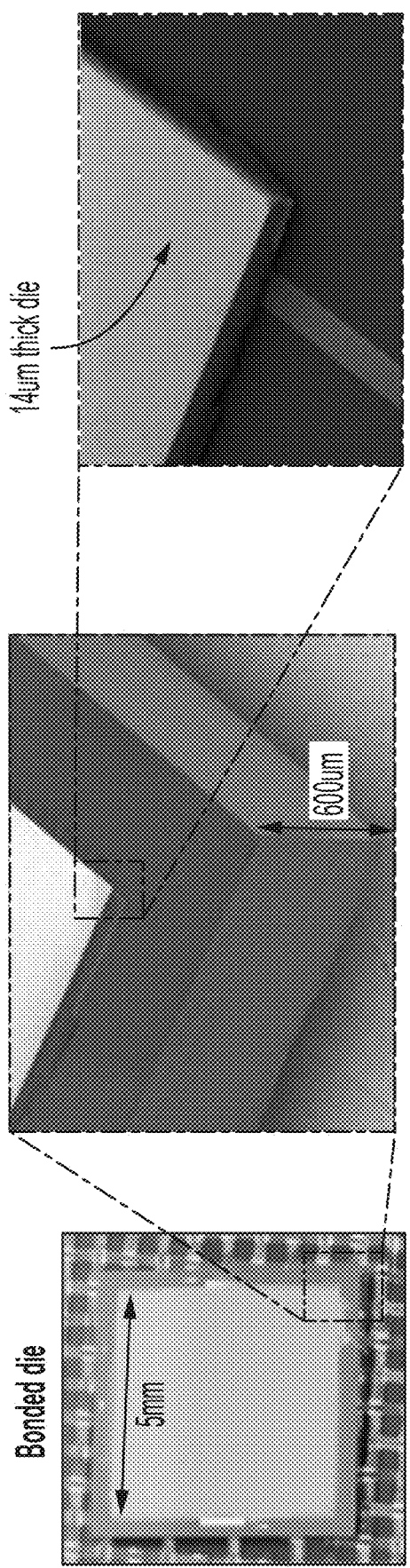
FIG. 6 is optical and scanning electron microscopy (SEM) images of a bonded stack according to one or more of the present embodiments.

FIG. 6 shows optical and SEM images of the bonded stack using the die shown in FIG. 4A As shown in FIG. 6, a 14 um-thick die was successfully bonded to a 600 um-thick substrate substantially without any deformation (e.g., without any major or substantial deformation).

Figure 7A:
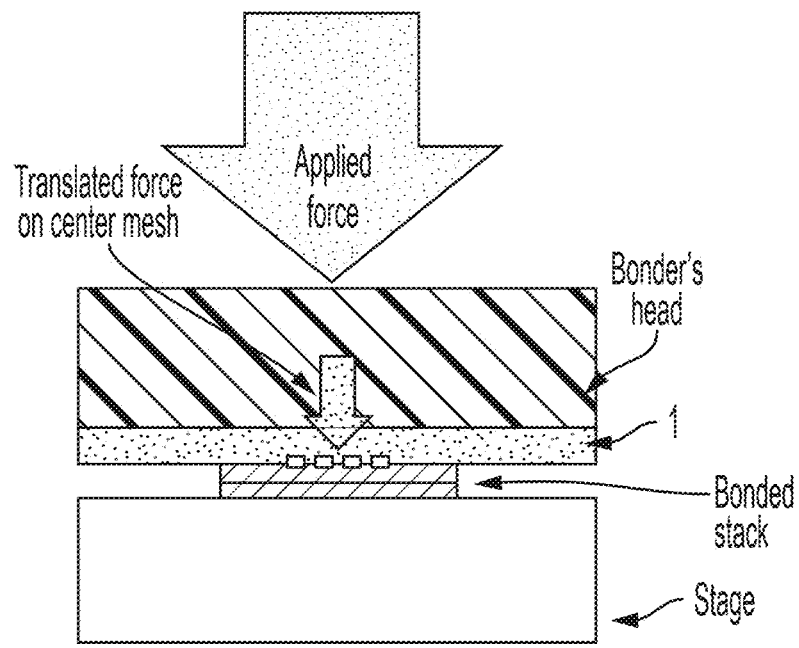
FIG. 7A is an illustration of a bond setup according to one or more of the present embodiments.

FIG. 7A is an illustration of a bond setup according to one or more embodiments of the present disclosure. As can be seen from the image, the bond tool 1 of the present embodiments may be bonded to a bonder's head (e.g., a head of a die bonding equipment or die bonder). Vacuum pressure (or vacuum suction) may be utilized to pick up and hold a die substrate in a substantially flat position. Once the die substrate is transferred to and positioned on top of a receiving substrate, force and temperature are applied to the bonder's head to adhere the die to the receiving substrate.

Figure 7B:
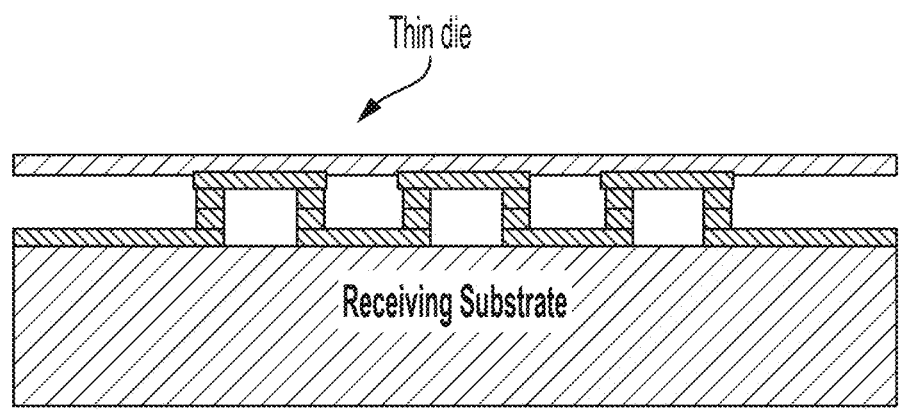
FIG. 7B is an illustration of a thin die bonded to a receiving substrate according to one or more of the present embodiments.

FIG. 7B is an illustration of the thin die bonded to the receiving substrate. The zig-zag pattern in the image corresponds to daisy chain metals forming electrical connection after the bonding.

A method for manufacturing the bond tool 1 according to one or more embodiments of the present disclosure will now be described with reference to FIGS. 8 to 12.

Figure 8:
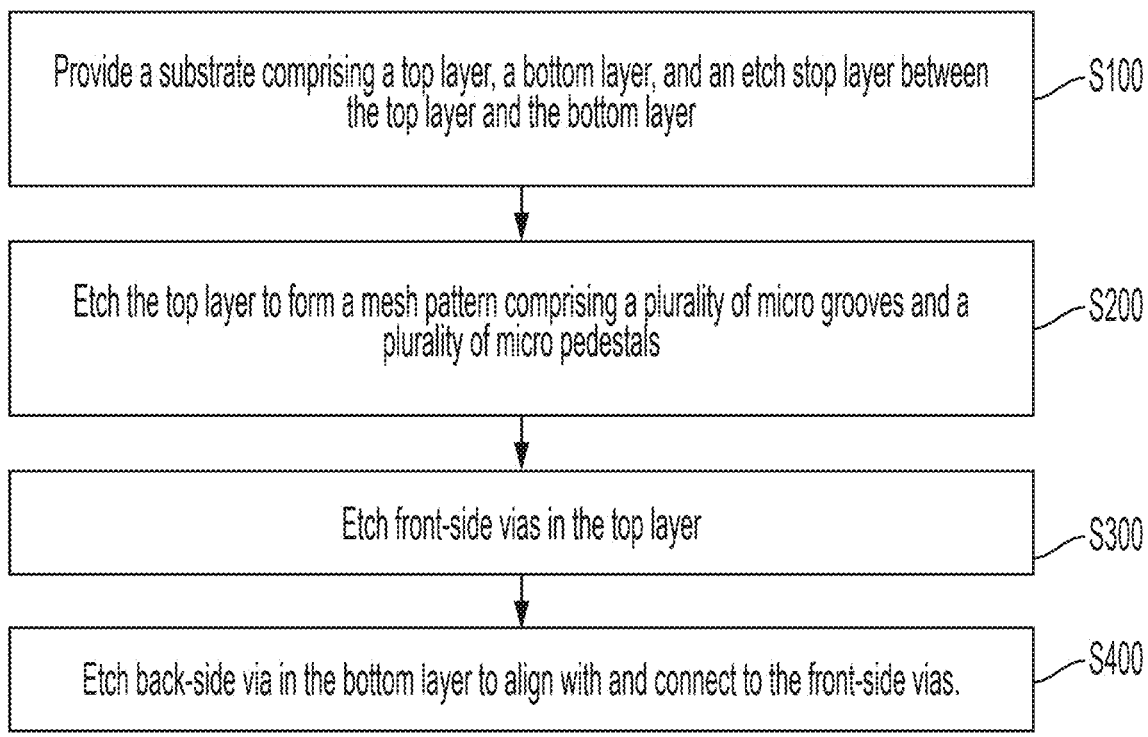
FIG. 8 is a flowchart of a method for manufacturing a bond tool according to one or more of the present embodiments.

As shown in FIG. 8, the manufacturing method for the bond tool 1 of the present embodiments may include providing a substrate 100 including a top layer 101, a bottom layer 102, and an etch stop layer 103 between the top layer 101 and the bottom layer 102 (S100); etching the top layer 101 to form a mesh pattern comprising a plurality of micro grooves 200 and micro pedestals 300 (S200); etching front-side vias 500 in a center portion 400 of the mesh pattern and through the top layer 101 of the substrate (S300); etching back-side via 600 through the bottom layer 102 and corresponding to the center portion 400 (S400).

Figure 9:
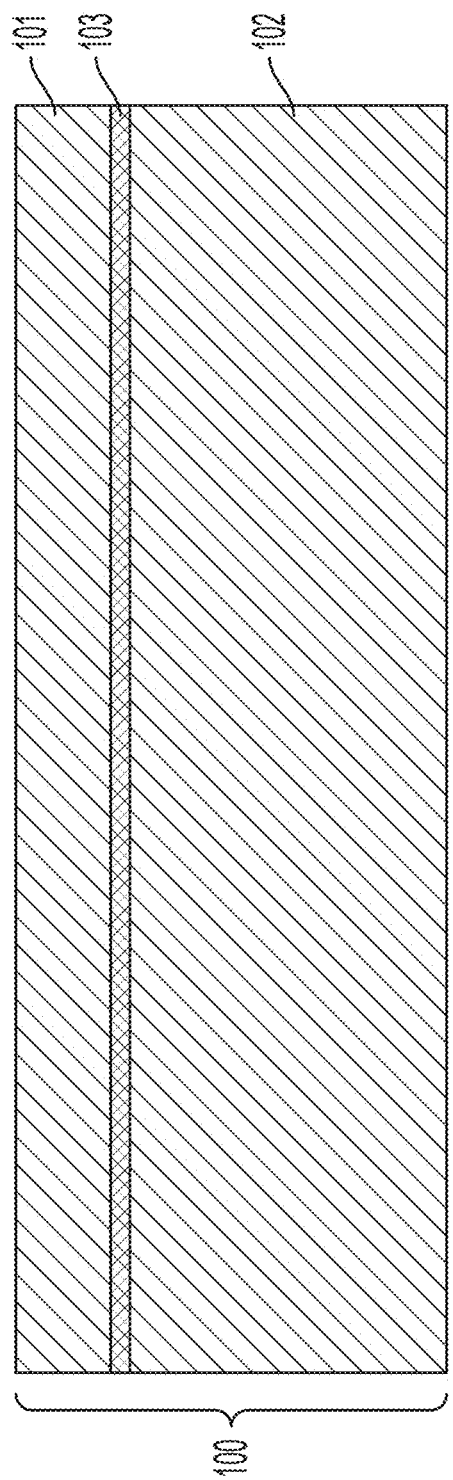
FIGS. 9-12 are cross-sectional images of acts of the method for manufacturing the bond tool according to one or more of the present embodiments.

As shown in FIG. 9, the substrate 100 is prepared and includes the top layer 101, the bottom layer 102, and the etch stop layer 103. A thickness of the top layer 101 may be in a range of 100-200 um, for example, 150 um, but embodiments of the present disclosure are not limited thereto. The top layer 101 may be formed of the same material as the substrate 100. For example, the top layer 101 may be formed of silicon (Si), silicon germanium (SiGe), silicon-on-insulator (SOI), III-V semiconductors (such as gallium arsenide (GaAs) and/or indium phosphide (InP)), glass materials, etc., without limitation.

The bottom layer 102 may be formed of the same material as the top layer 101. For example, the top layer 101 may be formed of silicon (Si), silicon germanium (SiGe), silicon-on-insulator (SOI), III-V semiconductors (such as gallium arsenide (GaAs) and/or indium phosphide (InP)), glass materials, etc., without limitation. According to one or more embodiments, the bottom layer 102 may have a thickness in a range of 300-1000 um, for example, be 450 um thick, or 400 um thick, but embodiments of the present disclosure are not limited thereto.

The etch stop layer 103 may have a thickness in a range of 1-5 um, but embodiments of the present disclosure are not limited thereto. The etch stop layer 103 may be formed of any suitable material capable of functioning as a stop against (e.g., resisting) the etching process utilized to etch the front-side vias 500. For example, the etch stop layer 103 may be formed of silicon oxide, silicon dioxide, silicon nitride, etc., without limitation.

Figure 10:
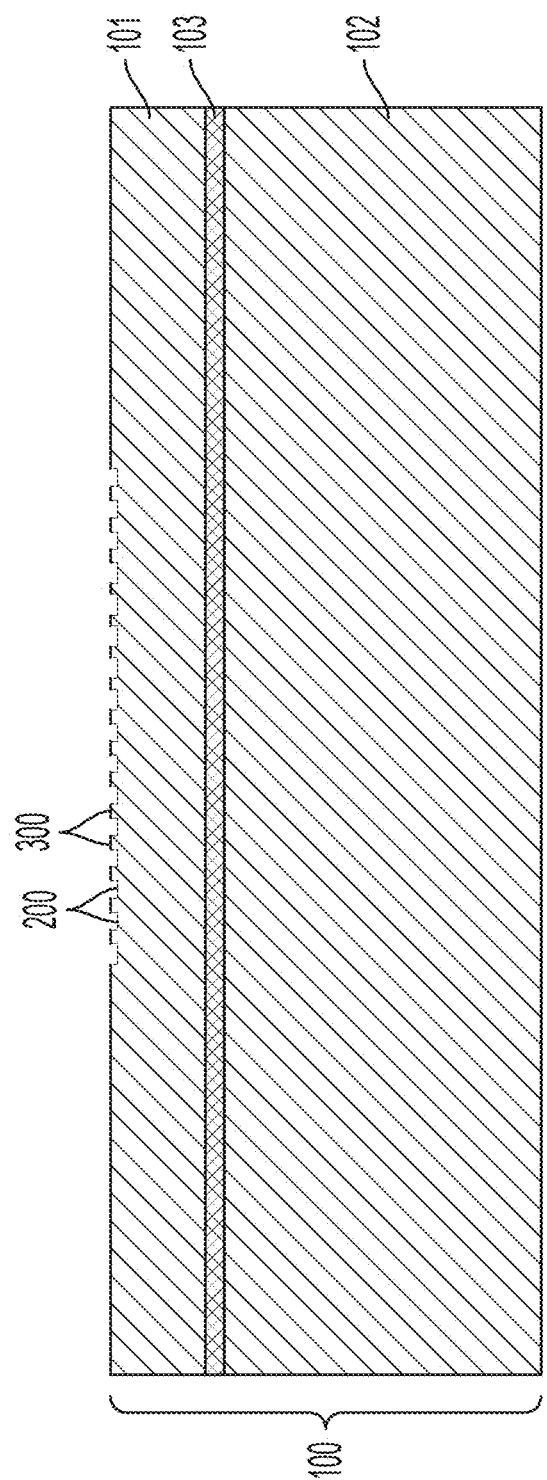

As shown in FIG. 10, the top layer 101 is then etched to form a mesh pattern comprising a plurality of micro grooves 200 and micro pedestals 300. For example, the plurality of micro grooves 200 are etched into the top layer 101, and the remaining unetched portions of the top layer 101 form the plurality of micro pedestals 300.

The micro grooves 200 may have a depth, in a thickness direction of the substrate 100, in a range of 1-10 um, for example, 2 um. A width of each of the micro grooves 200 may be in a range of 1-20 um, for example, 10 um. The micro pedestals 300 may have a square shape, when viewed in a plan view, however embodiments of the present disclosure are not limited thereto. When the micro pedestals 300 have a square shape, the dimensions of each micro pedestal 300 may be in a range of 1 um by 1 um to 20 um by 20 um, for example, 10 um by 10 um.

Techniques for etching the substrate 100 are not particularly limited and may include any suitable etching technique. For example, the plurality of micro grooves 200 may be etched into the substrate 100 by reactive ion etching (e.g., RIE and/or RIE/ICP), wet etching, dry etching, or ion milling, but embodiments of the present disclosure are not limited thereto. For example, the etching may be performed by a wet etching technique (using liquid chemicals to remove materials from the substrate) or a dry etching technique (using chemically reactive plasma to remove materials from the substrate). According to one or more embodiments, dry etching may be used, and it may be performed with a fluorinated plasma, for example, a $SF_6$ plasma. The etching may be performed using an organic resist material or an inorganic hard mask. The inorganic hard mask may be made of, for example, silicon oxide, silicon nitride, and/or an $HfO_2$ material.

Figure 11:
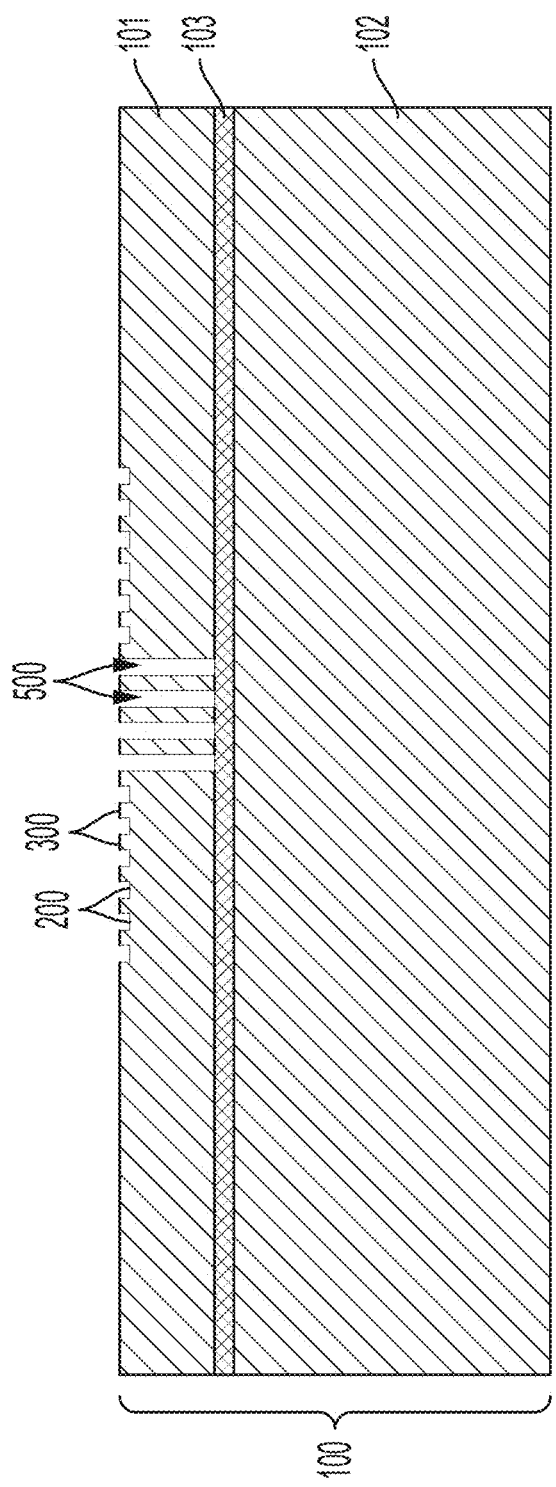

As shown in FIG. 11, a plurality of front-side vias 500 are then etched in the top layer 101. The front-side vias 500 do not penetrate the etch stop layer 103. The front-side vias 500 may be etched utilizing the same technique used for etching the mesh pattern, with the etch stop layer 103 acting to prevent the etching of underlying bottom layer 102. The front-side vias 500 may have a depth in the thickness direction of the substrate in a range of 100-200 um, for example, 150 um. The front-side vias 500 may be etched in portions of the micro grooves 200, and may be positioned substantially in a center between four adjacent micro pedestals 300 that together form a square pattern. The front-side vias 500 may have any suitable shape, for example, a shape of a rod, a column, etc. The front-side vias 500 may collectively be arranged so as to align (or substantially align) with a center of the back-side via 600. This centricity of the positioning of the front-side vias 500 (relative to the micro pedestals 300 and relative to the back-side via 600) leads to improved bonding results in terms of uniformity and/or symmetry of the resulting bond stack. The front-side vias 500 may be formed in the center portion 400 of the mesh pattern, as described in more detail herein above.

Figure 12:
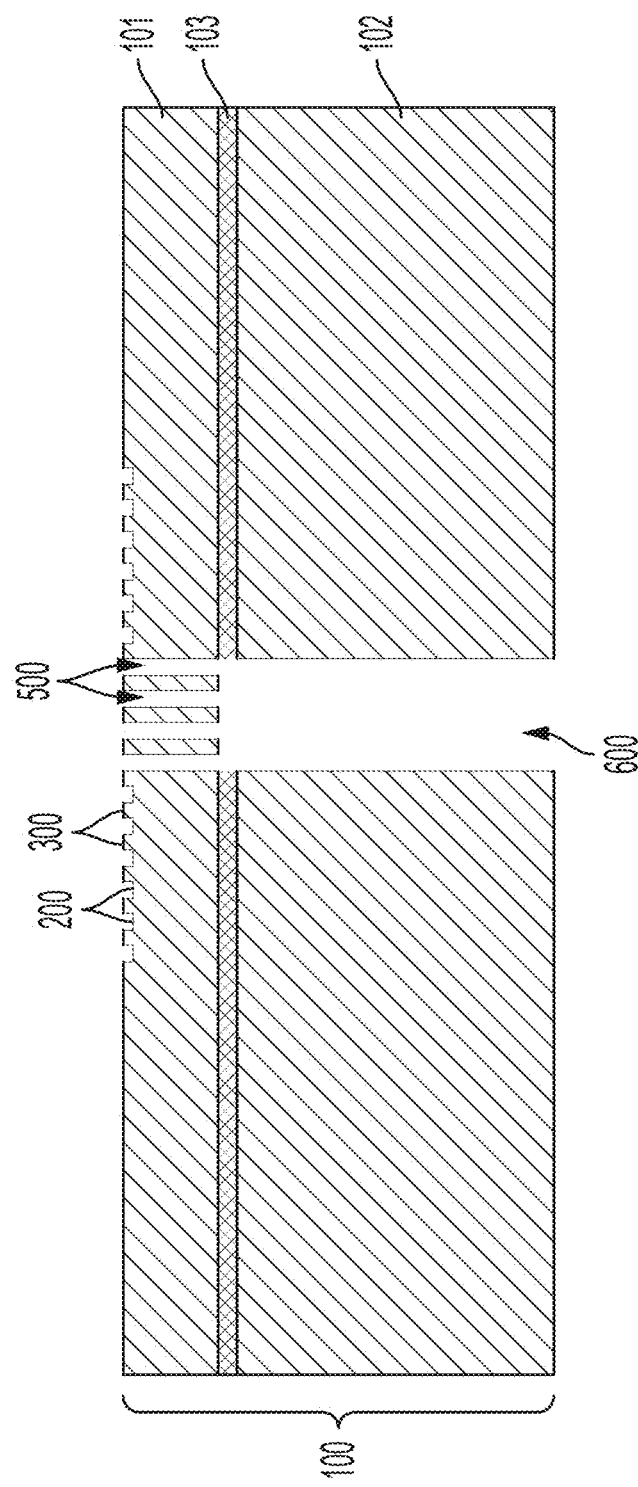

Then, as shown in FIG. 12, a back-side via 600 is etched in the bottom layer 102 and the etch stop layer 103. The back-side via 600 may penetrate the bottom layer 102 and the etch stop layer 103, and may connect to the front-side vias to form a continuous central opening in the substrate 100. The back-side via 600 may be etched in substantially the same manner as the micro grooves 200 and the front-side vias 500.

As discussed above, the bond tool 1 may be manufactured in a cleanroom facility in which conditions are suitably controlled for the manufacture of the bond tool 1. For example, Class 1000, Class 100, and/or Class 1 cleanroom may be utilized.

Figure 13:
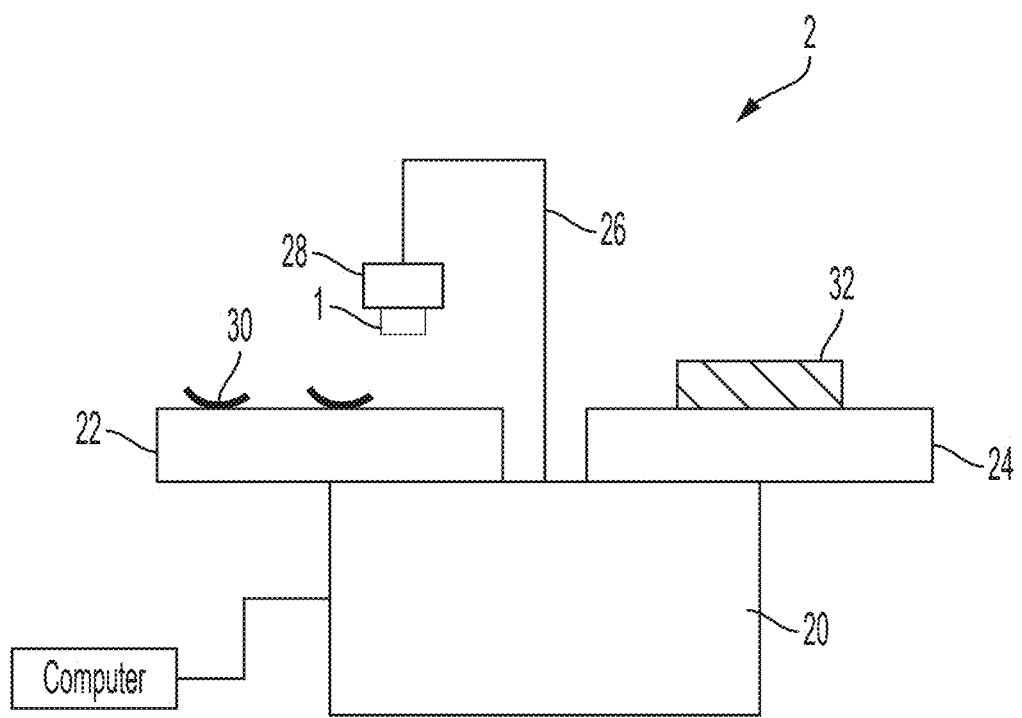
FIG. 13 is a schematic representation of a die bonder utilizing the bond tool according to one or more of the present embodiments.

FIG. 13 is a schematic representation of an example die bonder utilizing the bond tool 1 of the present embodiments. As shown in FIG. 13, a die bonder 2 may include a base 20, a picking platform 22, a stage 24, a bonder's arm 26, and a bonder's head 28. The base 20 may be connected to a computer.

The picking platform 22 may be configured to hold die substrates 30 to be picked up and bonded to a corresponding receiving substrate. The die substrates 30 may be ultra thin dies with thicknesses of or below 20 um, and may have a relatively high degree of curvature.

The die bonder 2 may further include the bonder's arm 26 configured to rotate on the base 20. For example, the bonder's arm may first rotate towards the picking platform 22, and after the die substrate 30 is picked up, may then rotate towards the stage 24. In addition to rotating, the bonder's arm may also move up and down, to enable the bonder's head 28 to pick up, lift, move, and then bond the die substrates 30. The bonder's head 28 may be attached to the bonder's arm 26 on one end thereof, and may be attached to the bond tool 1 of the present embodiments on the other end thereof. The bond tool 1 may facilitate the picking up and transferring of the die substrates 30 via vacuum pressure (or vacuum suction).

Once the die substrate 30 is picked up by the bond tool 1 attached to the bonder's head 28, the bonder's arm 26 may rotate, with the die substrate 30 held by the bond tool 1 due to vacuum pressure, to be positioned over the stage 24. On the stage 24, a receiving substrate 32 may be provided. The receiving substrate 32 may be any suitable substrate to which it is desired to attached the die substrate 30. For example, the receiving substrate 32 may be a single layer or a plurality of layers forming a bonded stack.

When the die substrate 30 is positioned over the receiving substrate 32, the bonder's arm 26 may move down to place the die substrate 30 on the receiving substrate 32 (e.g., with or without a suitable adhesive layer therebetween), and then force is applied to the bonder's head 28 to adhere the die substrate 30 to the receiving substrate 32. The applied force may be of any suitable magnitude configured to suitably bond the die substrate 30 to the receiving substrate 32, for example, may be in a range of 1-400 Kg.

The bond tool 1 manufacturing according to the method of the present embodiments, may be utilized in a die bonder and may be adapted or configured to pick up and bond ultra thin dies (substrates) to a receiving substrate substantially without any deformation (e.g., without any major or substantial deformation). Furthermore, the bond tool 1 may also help flatten the dies that may have a high degree of curvature and hold the die flat (or substantially or suitably flat) during the transfer and bonding to the receiving substrate.

Furthermore, the bond tool 1 of the present embodiments may be manufactured in a cleanroom facility and utilizing semiconductor microfabrication techniques, and may therefore have micro dimensions that may not otherwise be achieved in machine shops utilizing machining techniques.

While this invention has been described in detail with particular references to embodiments thereof, the embodiments described herein are not intended to be exhaustive or to limit the scope of the invention to the exact forms disclosed. Persons skilled in the art and technology to which this invention pertains will appreciate that alterations and changes in the described structures and methods of assembly and operation can be practiced without meaningfully departing from the principles, spirit, and scope of this invention, as set forth in the following claims and equivalents thereof.

What is claimed is:

1. A bond tool for bonding ultra-thin substrates, the bond tool comprising:
 a mesh pattern comprising a plurality of micro grooves having a depth in a range of 1 to 10 um;
 a plurality of front-side vias in a center portion of the mesh pattern and having a depth in a range of 100 to 200 um; and
 a back-side via connected to the plurality of front-side vias,
 wherein the bond tool is a vacuum suction pick-up tool.

2. The bond tool of claim 1, wherein the plurality of micro grooves have a depth of 2 um.

3. The bond tool of claim 1, wherein the plurality of front-side vias have a depth of 150 um.

4. The bond tool of claim 1, further comprising:
 a substrate having a top layer and a bottom layer, wherein,
 the top layer comprises the plurality of micro grooves and the plurality of front-side vias, and
 the bottom layer comprises the back-side via.

5. The bond tool of claim 4, wherein the substrate further comprises an etch stop layer between the top layer and the bottom layer.

6. The bond tool of claim 5, wherein the back-side via penetrates the bottom layer and the etch stop layer, and
 the back-side via has a depth in a range of 300 to 1000 um.

7. The bond tool of claim 1, wherein the vacuum suction pick-up tool is configured to pick up ultra-thin substrates by vacuum suction.

8. The bond tool of claim 4, wherein the substrate is a semiconductor wafer.

9. The bond tool of claim 5, wherein the etch stop layer is a silicon oxide layer or a silicon dioxide layer.

10. The bond tool of claim 1, wherein the center portion of the mesh pattern and the back-side via have the same diameter.

11. The bond tool of claim 1, wherein the center portion of the mesh pattern and the back-side via each has a diameter of 50 to 1000 um.

12. The bond tool of claim 1, wherein the bond tool is configured to pick up ultra-thin substrates having a thickness of 20 um or less.

13. The bond tool of claim 1, wherein the bond tool is configured to be attached to a bond head of a die bonding equipment.

14. The bond tool of claim 1, wherein the bond tool is manufactured in a cleanroom facility.

15. The bond tool of claim 1, wherein the mesh pattern further comprises a plurality of pedestals between the plurality of micro grooves, each of the plurality of pedestals being a square, and
 wherein a width of each of the plurality of micro grooves is in a range of 1 to 20 um.

16. A method of manufacturing a bond tool for bonding ultra-thin substrates, the method comprising:
 providing a substrate comprising a top layer, a bottom layer, and an etch stop layer between the top layer and the bottom layer;
 etching the top layer to form a mesh pattern comprising a plurality of micro grooves and a plurality of micro pedestals between the plurality of micro grooves;
 etching a plurality of front-side vias in the top layer; and
 etching a back-side via in the bottom layer to align with and connect to the front-side vias,
 wherein the bond tool is a vacuum pressure tool configured to pick up ultra-thin substrates by vacuum suction.

17. The method of claim 16, wherein the plurality of micro grooves have a depth in a range of 1 to 10 um.

18. The method of claim 16, wherein the plurality of front-side vias have a depth in a range of 100 to 200 um.

19. The method of claim 16, wherein the plurality of front-side vias are etched in a center portion of the mesh pattern, and
 wherein the center portion and the back-side via have the same diameter.

20. The method of claim 16, wherein each of the plurality of micro pedestals is a square, and
 wherein adjacent ones of the plurality of micro pedestals are spaced apart from each other by 1 to 20 um.

21. The method of claim 16, further comprising dicing the substrate into a plurality of pieces to a size compatible with intended die bonding equipment.

22. A system of manufacturing a bond tool for bonding ultra-thin substrates, the system comprising:
 means for providing a substrate comprising a top layer, a bottom layer, and an etch stop layer between the top layer and the bottom layer;

means for etching the top layer to form a mesh pattern comprising a plurality of micro grooves and a plurality of micro pedestals between the plurality of micro grooves;

means for etching a plurality of front-side vias in the top layer; and means for etching a back-side via in the bottom layer to align with and connect to the front-side vias, wherein the bond tool is a vacuum suction pick-up tool.

23. The system of claim 22, wherein the plurality of front-side vias are in a center portion of the mesh pattern.

24. The system of claim 22, further comprising means for dicing the substrate into a plurality of pieces to a size compatible with intended die bonding equipment.

* * * * *